(12) United States Patent
Lee et al.

(10) Patent No.: US 8,067,765 B2
(45) Date of Patent: Nov. 29, 2011

(54) ORGANIC LIGHT EMITTING ELEMENT AND ORGANIC LIGHT EMITTING DEVICE INCLUDING THE SAME

(75) Inventors: Sung-Hun Lee, Seoul (KR); Jung-Bae Song, Seongnam-si (KR); Sung-Soo Lee, Suwon-si (KR)

(73) Assignee: Samsung Electronics, Co., Ltd., Suwon-Si (KR)

( * ) Notice: Subject to any disclaimer, the term of this patent is extended or adjusted under 35 U.S.C. 154(b) by 281 days.

(21) Appl. No.: 12/437,321

(22) Filed: May 7, 2009

(65) Prior Publication Data

US 2010/0133517 A1 Jun. 3, 2010

(30) Foreign Application Priority Data

Dec. 1, 2008 (KR) .................. 10-2008-0120712

(51) Int. Cl.
*H01L 29/08* (2006.01)
(52) U.S. Cl. .............. 257/40; 257/E51.018; 438/82; 438/99
(58) Field of Classification Search ............. 257/40
See application file for complete search history.

(56) References Cited

U.S. PATENT DOCUMENTS

| | | |
|---|---|---|
| 7,126,267 B2 | 10/2006 | Liao et al. |
| 7,273,663 B2 | 9/2007 | Liao et al. |
| 2003/0170491 A1* | 9/2003 | Liao et al. ............ 428/690 |
| 2005/0035353 A1* | 2/2005 | Adachi et al. .......... 257/72 |
| 2006/0181202 A1* | 8/2006 | Liao et al. ............ 313/504 |
| 2008/0007168 A1 | 1/2008 | Lee et al. |
| 2008/0074047 A1 | 3/2008 | Lee et al. |

FOREIGN PATENT DOCUMENTS

| | | |
|---|---|---|
| KR | 1999-0031400 | 5/1999 |
| KR | 1020060001821 | 1/2006 |
| KR | 1020070020467 | 2/2007 |
| KR | 1020070067155 | 6/2007 |
| KR | 102007011720 | 12/2007 |

OTHER PUBLICATIONS

Gao, Weiying. Electronic structure and current injection in zinc phthalocyanine doped with tetrafluorotetracyanoquinodimethane: Interface versus bulk effects. 2002. Organic Electronics 3 (2002)—Elsevier. pp. 53-63.*
English Abstract for Publication No. 100263757 (for 1999-0031400), May 2000.
English Abstract for Publication No. 1020060001821, Jan. 2006.
English Abstract for Publication No. 1020070020467, Feb. 2007.
English Abstract for Publication No. 1020070067155, Jun. 2007.
English Abstract for Publication No. 1020070114720, Apr. 2007.

* cited by examiner

*Primary Examiner* — Ajay K Arora
(74) *Attorney, Agent, or Firm* — F. Chau & Associates, LCC

(57) ABSTRACT

An organic light emitting element and an organic light emitting device including the same is provided. At least one p-type or n-type overdoping layer is formed between two light emitting members forming a p-n junction in the organic light emitting element.

19 Claims, 10 Drawing Sheets

FIG.10

| (n-ETL/n+ETL/p+HTL/p-HTL) | Color corrdinate (@4,000 nit) | | Current efficiency (cd/A) (@4,000 nit) | Power efficiency (Lm/W) (@4,000 nit) | External quantum efficiency (%) (@4,000 nit) |
|---|---|---|---|---|---|
| | x | y | | | |
| C-5 | 0.272 | 0.289 | 24.59@9.18V | 8.39 | 13.4 |
| C-4 | 0.271 | 0.288 | 24.88@9.15V | 8.55 | 13.5 |
| C-3 | 0.274 | 0.288 | 24.86@9.18V | 8.52 | 13.5 |
| C-2 | 0.27 | 0.288 | 25.43@9.41V | 8.49 | 13.9 |
| C-1 | 0.27 | 0.29 | 24.29@9.87V | 7.79 | 13.2 |
| B | 0.271 | 0.288 | 24.9@9.93V | 7.88 | 13.6 |

ORGANIC LIGHT EMITTING ELEMENT AND ORGANIC LIGHT EMITTING DEVICE INCLUDING THE SAME

CROSS-REFERENCE TO RELATED APPLICATION

This application claims priority to and the benefit of Korean Patent Application No. 10-2008-0120712 filed in the Korean Intellectual Property Office on Dec. 1, 2008, the entire contents of which are incorporated herein by reference.

BACKGROUND OF THE INVENTION (a) Field of the Invention

The present disclosure relates to display devices, and more particularly, to an organic light emitting element having organic light emitting members overlapped with each other and an organic light emitting device including the same.

(b) Discussion of the Related Art

Currently, with the increased demand for lighter or thinner monitors and TVs, cathode ray tubes (CRTs) are being replaced by liquid crystal displays (LCDs).

However, because the LCD is a passive display device, an additional back-light as a light source is needed, and the LCD may have a slow response time and a narrow viewing angle.

Among the flat panel displays, an organic light emitting device, namely, an organic light emitting diode (OLED) display, has recently been promising as a display device.

The organic light emitting device includes a plurality of organic light emitting elements. The organic light emitting elements each include an anode and a cathode, and an organic light emitting member therebetween.

The organic light emitting member emits white light or light of primary colors, and includes an emission layer and an auxiliary layer such as an electron injection layer, a hole injection layer, an electron transport layer, and a hole transport layer. In the case of an organic light emitting member emitting white light, the emission layer generally has a structure in which emission materials emitting three primary colors such as red, green, and blue, are deposited.

However, the typical organic light emitting element may exhibit low emission efficiency and have a short lifetime. Also, a high voltage is needed to generate the current used.

SUMMARY OF THE INVENTION

Exemplary embodiments of the present invention provide an organic light emitting element and an organic light emitting device including the same in which emission efficiency and lifetime are increased, and that are driven with a low voltage.

In an organic light emitting element in which two or more light emitting members are overlapped, at least one p-type or n-type overdoping layer is formed between two light emitting members forming a p-n junction.

An organic light emitting element according to an exemplary embodiment of the present invention includes: a first electrode; a first emission layer emitting light; a first impurity layer of a first conductive type that contacts the first emission layer; an overdoping layer that contacts the first impurity layer; a second impurity layer of a second conductive type that contacts the overdoping layer; a second emission layer that contacts the second impurity layer and emits light; and a second electrode that faces the first electrode.

A third impurity layer of the second conductive type between the first electrode and the first emission layer, and a fourth impurity layer of the first conductive type between the second electrode and the second emission layer may be further included.

The overdoping layer may include an overdoping layer of the first conductive type and an overdoping layer of the second conductive type. The overdoping layer of the first conductive type may contact the first impurity layer of the first conductive type. The overdoping layer of the second conductive type may contact the second impurity layer of the second conductive type.

A host and a dopant of the overdoping layer of the first conductive type may be the same host and dopant of the first impurity layer of the first conductive type that contacts the overdoping layer of the first conductive type. A host and a dopant of the overdoping layer of the second conductive type may be the same host and dopant of the second impurity layer of the second conductive type that contacts the overdoping layer of the second conductive type.

The thickness of the overdoping layer and the first impurity layer of the first conductive type may be the same as the thickness of the overdoping layer and the second impurity layer of the second conductive type.

The overdoping layer may include one of the overdoping layers of the first or second conductive type.

The second impurity layer of the second conductive type that contacts the overdoping layer may be of a material included in one of an organic p doping group, a deep lumo hole injection layer group, or an oxide metal group. The first impurity layer of the first conductive type that contacts the overdoping layer may be of a material of an organic n doping group.

The overdoping layer may be the n-type overdoping layer when the second impurity layer of the second conductive type is made of the material included in the deep lumo hole injection layer group or the oxide metal group.

The first emission layer and the second emission layer may include two or more sub-emission layers emitting light of different colors. The sum of the light emitted from the two or more sub-emission layers may be a white color.

The first emission layer and the second emission layer may emit the same primary color.

The first electrode as a pixel electrode may be made of IZO or ITO. The second electrode as a common electrode may be made of a metal, such as Al.

An organic light emitting device according to an exemplary embodiment of the present invention includes: an organic light emitting element including an anode, a cathode, and an organic light emitting member between the anode and the cathode; a driving transistor connected to the organic light emitting element; a switching transistor connected to the driving transistor; a gate line connected to the switching transistor; and a data line connected to the switching transistor and insulated from the gate line. The organic light emitting member includes a first light emitting member including a first emission layer and a first n-type impurity layer, a second light emitting member including a second emission layer and a second p-type impurity layer, and an overdoping layer between the first light emitting member and the second light emitting member.

The overdoping layer may include an n-type overdoping layer and a p-type overdoping layer. The n-type overdoping layer may contact the first n-type impurity layer of the first light emitting member. The p-type overdoping layer may contact the second p-type impurity layer of the second light emitting member.

The host and dopant of the n-type overdoping layer may be the same as the host and dopant of the first n-type impurity layer contacting the n-type overdoping layer. The host and dopant of the p-type overdoping layer may be the same as the host and dopant of the second p-type impurity layer contacting the p-type overdoping layer.

The overdoping layer may include one of the n-type overdoping layer or the p-type overdoping layer.

When the overdoping layer is the n-type overdoping layer, the second p-type impurity layer may be of a material included in one of an organic p doping group, a deep lumo hole injection layer group, or an oxide metal group and the first n-type impurity layer may be of a material of an organic n doping group When the overdoping layer is the p-type overdoping layer, the second p-type impurity layer may be of a material included in the organic p doping group, and the first n-type impurity layer may be of a material included in the organic n doping group.

The first light emitting member may further include a first p-type impurity layer. The second light emitting member may further include a second n-type impurity layer.

In an organic light emitting element in which the two or more light emitting members are overlapped with each other, two emission layers are deposited via the n-type impurity layer and the p-type impurity layer thereby forming the p-n junction. At least one p-type overdoping layer or n-type overdoping layer is between the n-type impurity layer and the p-type impurity layer forming the p-n junction, such that the driving voltage may be reduced while maintaining the maximum current efficiency characteristic of the organic light emitting element. Also, the two or more organic light emitting members are overlapped with each other such that the lifetime of the organic light emitting element is increased.

The thickness of the overdoping layer may be about 35 Å or more.

The n-type overdoping layer or the p-type overdoping layer may have a thickness of about 35 Å or more, and the sum of the thickness of the n-type overdoping layer and the p-type overdoping layer may be about 70 Å or more.

The overdoping layer of the first or second conductive type may have a thickness of about 35 Å or more, and the sum of the thickness of the overdoping layer of the first or second conductive type may be about 70 Å or more.

The thickness of the n-type overdoping layer and the first n-type impurity layer may be the same as the thickness of the p-type overdoping layer and the second p-type impurity layer.

The doping amount of the overdoping layer and of the impurity layer may be determined with reference to a weight percent (wt %) of the host and the dopant.

The doping amount of the overdoping layer may be more than about 1.2 times and less than about 20 times the doping amount of the impurity layer contacting the overdoping layer.

The doping amount of the overdoping layer may be more than about 1.2 times and less than about 20 times the doping amount of one of the second impurity layer of the second conductive type or the third impurity layer of the first conductive type that contacts the overdoping layer.

The doping amount of the overdoping layer may be more than about 1.5 times and less than about 5 times the doping amount of one of the second impurity layer of the second conductive type or the first impurity layer of the first conductive type that contacts the overdoping layer.

BRIEF DESCRIPTION OF THE DRAWINGS

FIG. 10 is a table showing a color coordinates, current efficiency, power efficiency, and external quantum efficiency according to each exemplary embodiment of the present invention.

DETAILED DESCRIPTION OF THE EMBODIMENTS

Figure 1:
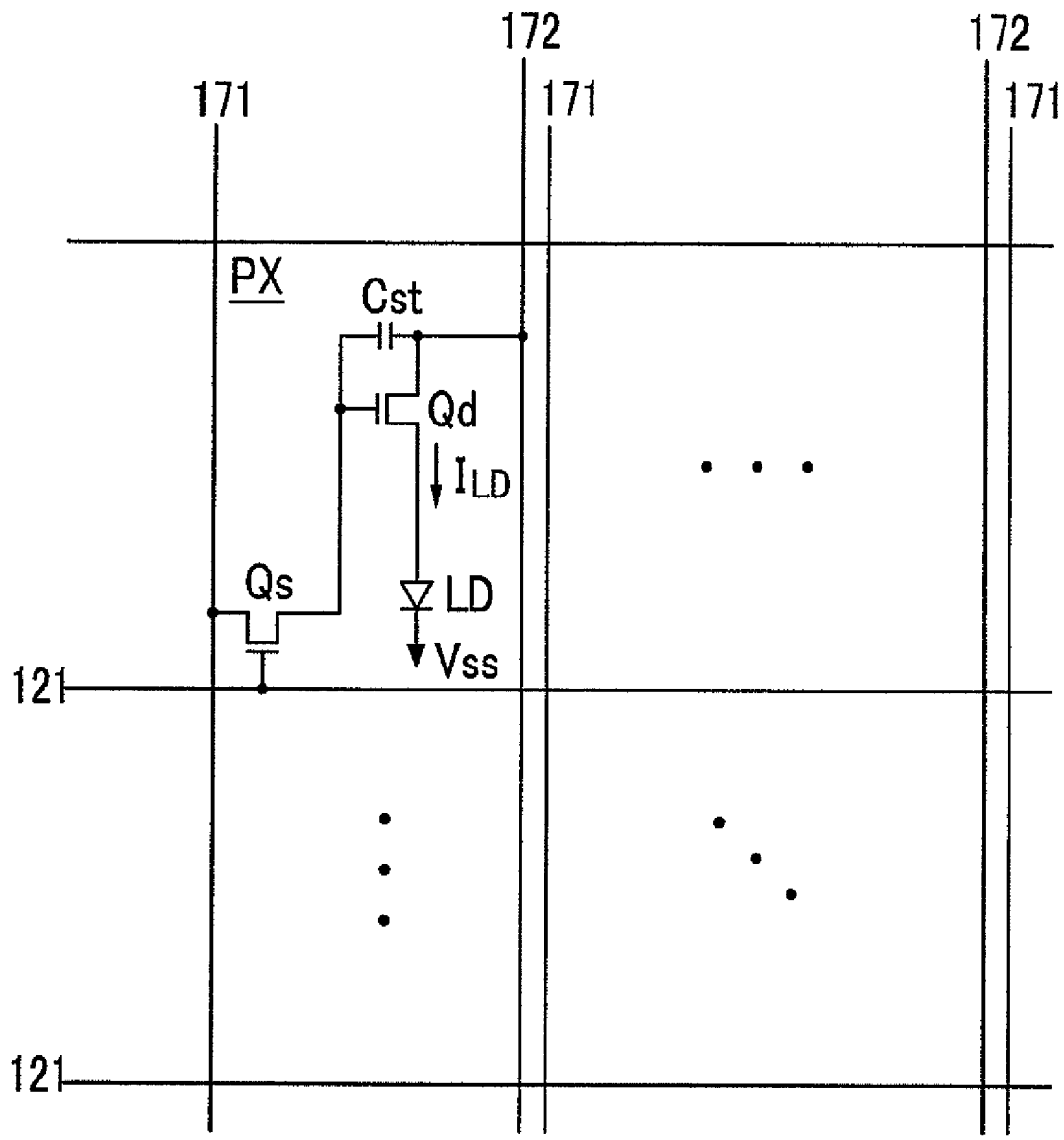
FIG. 1 is an equivalent circuit diagram of an organic light emitting device according to an exemplary embodiment of the present invention.

Referring to FIG. 1, an organic light emitting device according to the present exemplary embodiment includes a plurality of signal lines 121, 171, 172, and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate signal lines 121 extend in a row direction and are substantially parallel to each other, and the data lines 171 and the driving voltage lines 172 extend in a column direction and are substantially parallel to each other.

Each pixel PX includes a switching transistor Qs, a driving transistor Qd, a storage capacitor Cst, and an organic light emitting element LD.

The switching transistor Qs has a control terminal connected to one of the gate lines 121, an input terminal connected to one of the data lines 171, and an output terminal connected to the driving transistor Qd. The switching transistor Qs transmits data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting element LD. The driving transistor Qd drives an output current ILD having a magnitude depending on the voltage between the control terminal and the output terminal thereof.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting element LD has an anode connected to the output terminal of the driving transistor Qd and a cathode connected to a common voltage Vss. The organic light emitting element LD emits light having an intensity depending on an output current ILD of the driving transistor Qd, thereby displaying images.

The switching transistor Qs and the driving transistor Qd are n-channel field effect transistors (FETs). However, at least one of the switching transistor Qs and the driving transistor Qd may be a p-channel FET. In addition, as would be appreciated by those skilled in the art, the connections among the transistors Qs, Qd, the capacitor Cst, and the organic light emitting element LD may be modified.

Now, the structure of the organic light emitting device will be described in detail with reference to FIGS. 2 and 3 as well as FIG. 1.

Figure 2:
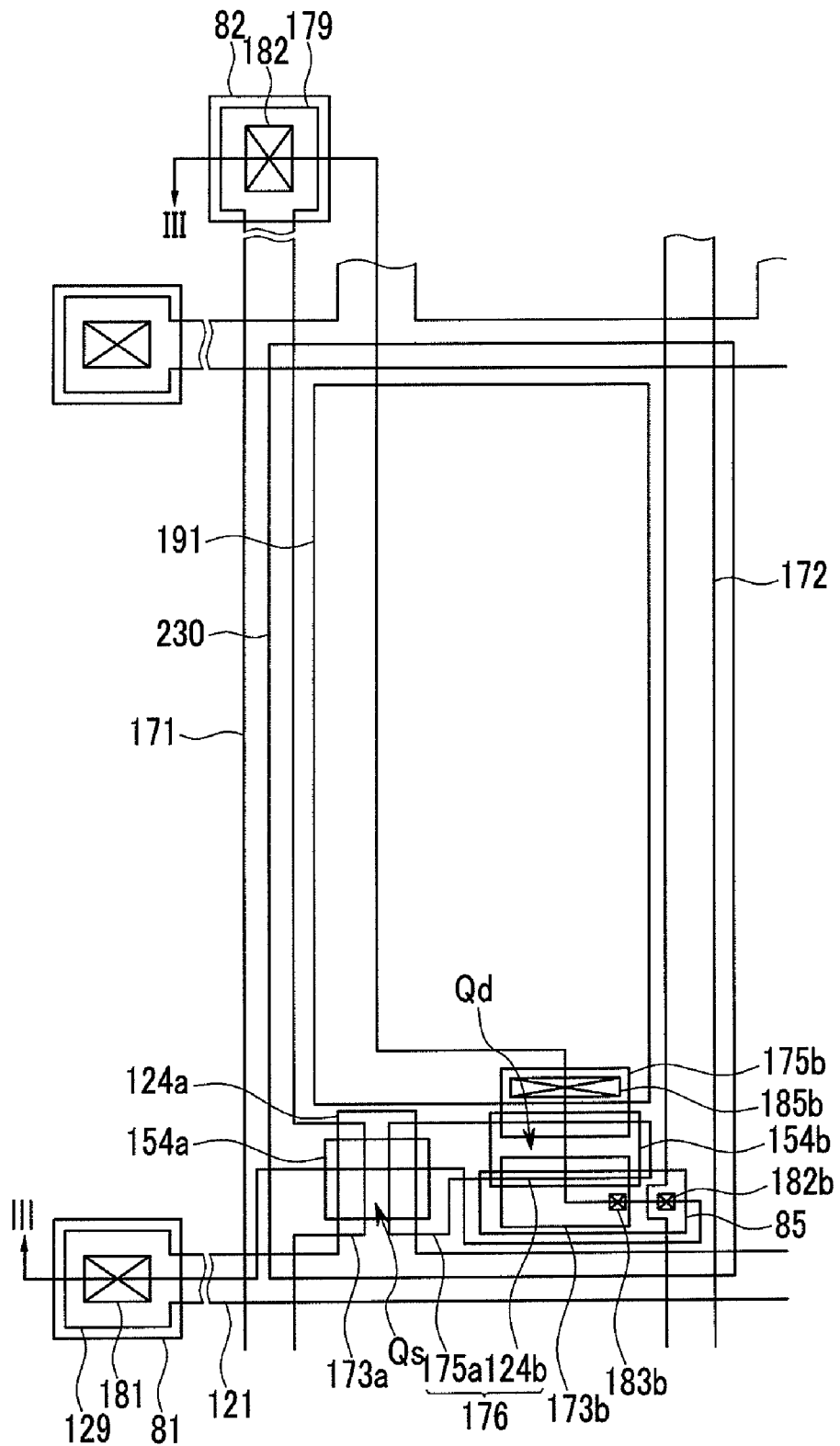
FIG. 2 is a layout view of one pixel in an organic light emitting device according to an exemplary embodiment of the present invention.
Figure 3:
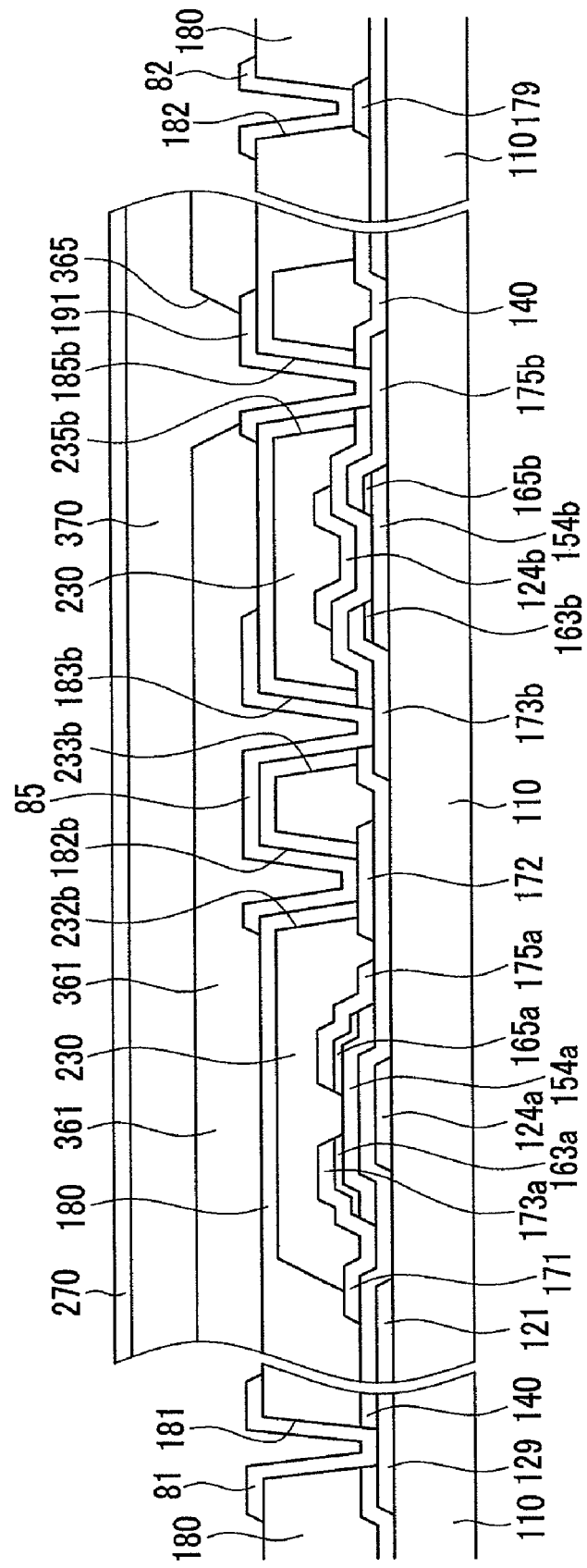
FIG. 3 is a cross-sectional view of the organic light emitting device shown in FIG. 2 taken the line III-III.

FIG. 2 is a layout view of one pixel in an organic light emitting device according to an exemplary embodiment of the present invention, and FIG. 3 is a cross-sectional view of the organic light emitting device shown in FIG. 2 taken the line III-III.

A plurality of semiconductor islands 154b for driving transistors (hereafter referred to as "driving semiconductors") are formed on a substrate 110. The driving semiconductor islands 154b may be made of a crystalline semiconductor such as microcrystalline silicon and polycrystalline silicon.

A plurality of pairs of ohmic contacts (hereafter referred to as "driving ohmic contacts") 163b, 165b for a driving transistor are formed on the driving semiconductor islands 154b. The driving ohmic contacts 163b, 165b have an island shape, and, in an exemplary embodiment, are made of a crystalline semiconductor material doped with an impurity such as polysilicon, microcrystalline silicon heavily doped with an n-type impurity such as phosphorous, or an amorphous semiconductor material.

A plurality of gate lines 121, a plurality of input electrodes 173b for the driving transistors (hereafter referred to as "driving input electrodes"), and a plurality of output electrodes 175b for the driving transistors (hereafter referred to as "driving output electrodes") are formed on the substrate 110 and the driving ohmic contacts 163b, 165b.

The gate lines 121 transmit gate signals and extend in a substantially row direction in FIG. 2. Each gate line 121 includes a plurality of control electrodes 124a for switching transistors (hereafter referred to as "switching control electrodes") projecting upward (in FIG. 2) from the gate line 121, and an end portion 129 having a large area for contact with another layer or an external driving circuit.

The driving input electrodes 173b and the driving output electrodes 175b are separated from the gate lines 121, and are respectively on the driving ohmic contacts 163b, 165b, and the substrate 110.

A gate insulating layer 140, in an exemplary embodiment being made of silicon oxide (SiO2) or silicon nitride (SiNx), is formed on the gate lines 121, the driving input electrodes 173b, the driving output electrodes 175b, and the exposed driving semiconductor islands 154b.

A plurality of semiconductor islands 154a for the switching transistors (hereafter referred to as "switching semiconductors") made of hydrogenated amorphous silicon are formed on the gate insulating layer 140. The switching semiconductors 154a are on the switching control electrodes 124a.

A plurality of pairs of ohmic contacts 163a, 165a for the switching transistors (hereafter referred to as "switching ohmic contacts") are formed on the switching semiconductors 154a. The switching semiconductors 154a have an island shape and are made of a material such as n+ hydrogenated amorphous silicon that is heavily doped with an n-type impurity such as phosphorous.

A plurality of data lines 171, a plurality of driving voltage lines 172, and a plurality of electrode members 176 are formed on the switching ohmic contacts 163a, 163b, and the gate insulating layer 140.

The data lines 171 for transmitting data signals extend substantially in the column direction in FIG. 2 and intersect the gate lines 121. Each data line 171 includes a plurality of input electrodes 173a for the switching transistors (hereafter referred to as "switching input electrodes") extending toward the switching control electrodes 124a and an end portion 179 having a large area for contact with another layer or an external driving circuit.

The driving voltage lines 172 for transmitting driving voltages extend substantially in the column direction, and intersect the gate lines 121.

The electrode members 176 are separated from the data lines 171 and the driving voltage lines 172. The electrode members 176 respectively include an output electrode 175a for the switching transistor (hereafter referred to as "a switching output electrode") and a control electrode 124b for the driving transistor (hereafter referred to as "a driving control electrode").

The switching output electrodes 175a are on the switching ohmic contacts 165a, and the driving control electrodes 124b are on the driving semiconductor islands 154b.

The gate lines 121, the data lines 171, the driving voltage lines 172, and the electrode members 176 may be made of the same material.

A plurality of color filters 230 are formed on the data lines 171, the driving voltage lines 172, the electrode members 176, and the exposed switching semiconductor islands 154a. However, if the organic light emitting device includes a white pixel, a color filter may not exist in the white pixel, or a transparent white color filter (not shown) may exist.

The color filters 230 have a plurality of through holes 232b, 233b, 235b. The through holes 232b expose the driving voltage lines 172, the through holes 233b expose the driving input electrodes 173b, and the through holes 235b expose the driving output electrodes 175b.

An interlayer insulating layer (not shown) may be formed under the color filters 230. The interlayer insulating layer may prevent pigments of the color filters 230 from flowing into the switching semiconductors 154a.

A passivation layer 180 is formed on the color filters 230B, the data lines 171, the driving voltage lines 172, and the electrode members 176.

The passivation layer 180 has a plurality of contact holes 182 exposing end portions 179 of the data lines 171, and a plurality of contact holes 182b exposing the driving voltage line 172 through the through holes 232b. The passivation layer 180 and the gate insulating layer 140 have a plurality of contact holes 181 exposing the end portions 129 of the gate lines 121, a plurality of contact holes 183b exposing the driving input electrodes 173b through the through holes 233b, and a plurality of contact holes 185b exposing the driving output electrodes 175b through the through holes 235b.

A plurality of pixel electrodes 191, a plurality of connecting members 85, and a plurality of contact assistants 81, 82 are formed on the passivation layer 180.

The pixel electrodes 191 are connected to the driving output electrodes 175b through the contact holes 185b.

The connecting members 85 are connected to the driving voltage lines 172 and the driving input electrodes 173b through the contact holes 182b, 183b, and portions thereof overlap the driving control electrodes 124b to form the storage capacitors Cst.

The contact assistants 81, 82 are respectively connected to the end portions 129, 179 of the gate lines 121 and the data lines 179 through the contact holes 181, 182. The contact assistants 81, 82 adhere the ends 179, 129 of the data lines 171 and gate lines 121 to outside components, and protect them.

The pixel electrodes 191, the connecting members 85, and the contact assistants 81 and 82 may be made of a transparent conductor such as ITO or IZO.

An insulating layer 361 is formed on the pixel electrodes 191 and the connecting members 85. The insulating layer 361 surrounds the edges of the pixel electrodes 191, thereby defining a plurality of openings 365.

An organic light emitting member 370 for emitting white light is formed on the insulating layer 361 and the pixel electrodes 191, and a common electrode 270 that is applied with the common voltage Vss is formed thereon.

The organic light emitting member 370 will be described in detail below with reference to FIG. 4.

The switching control electrode 124a electrically connected to the gate line 121, the switching input electrode 173a electrically connected to the data line 171, and the switching output electrode 175a form the switching thin film transistor Qs along with the switching semiconductor 154a, and the channel of the switching thin film transistor Qs is formed in the switching semiconductor 154a between the switching input electrode 173a and the switching output electrode 175a.

The driving control electrode 124b electrically connected to the switching output electrode 175a, the driving input electrode 173b electrically connected to the driving voltage line 172, the driving output electrode 175b connected to the pixel electrode 191, and the driving semiconductor 154b form the driving thin film transistor Qd, and the channel of the driving thin film transistor Qd is formed in the driving semiconductor 154b between the driving input electrode 173b and the driving output electrode 175b.

As above-described, the switching semiconductor 154a is made of the amorphous semiconductor and the driving semiconductor 154b is made of the crystallized semiconductor such that the characteristics required in each thin film transistor are simultaneously satisfied. However, the kinds of semiconductor included in the driving thin film transistor Qd and the switching thin film transistor Qs may be different from them. For example, both thin film transistors Qd, Qs may include the amorphous silicon or the crystallized silicon.

In FIGS. 2 and 3, the driving thin film transistor Qd is a top gate type and the switching thin film transistor Qs is a bottom gate type. However, the two thin film transistors Qd and Qs may have any appropriate structure.

According to another exemplary embodiment of the present invention, each pixel PX may include additional transistors to prevent or compensate for degradation of the organic light emitting element LD and the driving transistor Qd, as well as one switching transistor Qs and one driving transistor Qd.

Next, the organic light emitting member 370 will be described in more detail with reference to FIG. 4.

Figure 4:
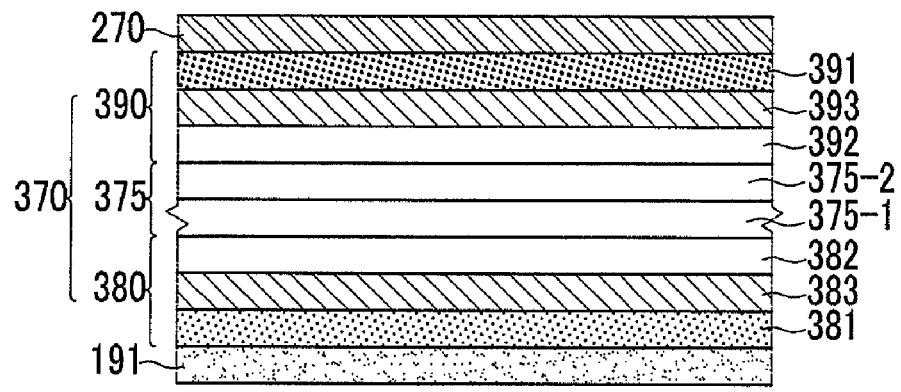
FIG. 4 is a schematically cross-sectional view of an organic light emitting diode according to an exemplary embodiment of the present invention.

As shown in FIG. 4, the organic light emitting member 370 includes a lower light emitting member 380 and an upper light emitting member 390, and an overdoping layer 375 therebetween. The present invention is applied to a structure in which two or more light emitting members are overlapped, and the most basic double overlapping structure as in FIG. 4 will be described.

The lower light emitting member 380 includes an emission layer 383 and impurity layers 381, 382 at both sides thereof. The upper light emitting 390 includes an emission layer 393 and impurity layers 391, 392 at both sides thereof. The overdoping layer 375 is between the lower light emitting member 380 and upper light emitting member 390.

The impurity layers 381, 382 of the lower light emitting member 380 include a p-type impurity layer 381 contacting the pixel electrode 191 and an n-type impurity layer 382 at the opposite side thereof. The impurity layers 391, 392 of the upper light emitting member 390 include an n-type impurity layer 391 contacting the common electrode 270 and a p-type impurity layer 392 at the opposite side thereof. The overdoping layer 375 is formed between the n-type impurity layer 382 of the lower light emitting member 380 and the p-type impurity layer 392 of the upper light emitting member 390, and the n-type impurity layer 382 of the lower light emitting member 380 and the p-type impurity layer 392 of the upper light emitting member 390 form a p-n junction along the overdoping layer 375. Hereafter, the n-type impurity layer 382 of the lower light emitting member 380 and the p-type impurity layer 392 of the upper light emitting member 390 for the p-n junction are respectively referred to as a p-n junction n-type impurity layer 382 and a p-n junction p-type impurity layer 392.

The overdoping layer 375 formed between the p-n junction n-type impurity layer 382 and the p-n junction p-type impurity layer 392 includes an n-type overdoping layer 375-1 contacting the p-n junction n-type impurity layer 382, and a p-type overdoping layer 375-2 contacting the p-n junction p-type impurity layer 392, and the n-type overdoping layer 375-1 and the p-type overdoping layer 375-2 contact each other.

Here, the n-type overdoping layer 375-1 may be doped with the same host and the same dopant as the n-type impurity layer 382 of the p-n junction contacting the n-type overdoping layer 375-1, and the weight percent of the doped dopant is relatively large as compared with the n-type impurity layer 382 of the p-n junction. The weight percent of the dopant doped of the n-type overdoping layer 375-1 may be about 1.2 times or more (in an exemplary embodiment, about 1.5 times or more) of the weight percent of the dopant doped of the n-type impurity layer 382 of the p-n junction.

Also, the p-type overdoping layer 375-2 may be doped with the same host and the same dopant as the p-type impurity layer 392 of the p-n junction, and the weight percent of the doped dopant is relatively large as compared with the p-type impurity layer 392 of the p-n junction. The weight percent of the doped dopant of the p-type overdoping layer 375-2 may be about 1.2 times or more of the weight percent of the doped dopant of the p-type impurity layer 392 of the p-n junction.

When the n-type or p-type overdoping layer 375-1, 375-2 is excessively doped the element characteristic may be deteriorated, such that the weight percent of the n-type or p-type overdoping layer 375-1, 375-2 may not be over about 20 times (in an exemplary embodiment about 5 times) the weight percent of the dopant of the impurity layers 382, 392.

Here, the p-type impurity layers 381, 392 may function as hole injection layers, and the n-type impurity layers 382, 391 may function as electron injection layers.

The two p-type impurity layers 381, 392 may be made of the same material, or may be made of different materials. The two n-type impurity layers 382, 391 may be made of the same material, or may be made of different materials.

The p-type impurity layers 381, 392 and the n-type impurity layers 382, 391 according to an exemplary embodiment of the present invention may be made of a material such as in Table 1 below which shows the characteristics of each material (junction characteristic, transmittance, stability).

TABLE 1

| Type | Material group | Material host | Material dopant | Junction characteristic | Transmittance/Stability |
|---|---|---|---|---|---|
| n-type impurity layer | Metal | Mg, Ag, Ca | no | Bad | Transmittance bad Stability bad |
| | Metal carbonate | ETL | Cs2CO3 | Good | Transmittance middle Stability bad for a high temperature |
| | Alkali metal | ETL | Mg, Cs, Li | Good | Transmittance middle Stability bad for a high temperature |
| | Organic n doping | ETL | NDN | Good | Transmittance good stability good for a high temperature |
| P-TYPE impurity layer | Metal oxide | V2O5, WO3, ITO, MoO3 | X | Good | transmittance good Stability good for a high temperature Independent deposition possibility |
| | Organic p doping | HTL | NDP, F4-TCNQ | Good | Transmittance good Stability good for a high temperature |
| | Deep LUMO HIL | L101C | X | Good | Transmittance good Stability good for a high temperature Independent deposition possibility |
| | Metal | Au, Ag | X | Bad | Transmittance bad Stability bad |

In Table 1, "X" represents the case where the dopant is not used, "ETL" as the electron transport layer includes a layer formed of the material having the function for transporting the electrons, and "HTL" as the hole transport layer includes a layer formed of the material having the function for transporting the holes. "F4-TCNQ" is tetrafluoro-tetracyanoquinodimethane, and L101C is its product name.

As shown in Table 1, the n-type impurity layer 382, 391 is largely classified into the metal group, the metal carbonate group, the alkali metal group, and the organic n doping group, and the characteristics of the organic n doping group are best. The junction characteristic of the metal carbonate group and the alkali metal group is good, however the stability is bad such that the characteristics are not good. On the other hand, the p-type impurity layers 381, 392 may be classified into the metal oxide group, the organic p doping group, a deep lowest unoccupied molecular orbital (LUMO) hole injection layer (HIL) group, and the metal group, and all except the metal group have good characteristics.

On the other hand, when the p-type impurity layer 381, 392 and n-type impurity layer 382, 391 are connected to each other by using the various materials, the characteristics may be summarized as below in Table 2.

TABLE 2

| Junction structure (p-type impurity layer/n-type impurity layer) | Carrier injection capacity | Light transmittance | Deposition affinity | Stability |
|---|---|---|---|---|
| Metal/metal | According to case | Low | Low | Low |
| Inorganic material/inorganic material | Low | Middle | Low | High |
| Organic material/organic material | High | High | High | High |
| Hybrid | High | High | Middle | Middle |

In Table 2, the hybrid structure shows the case in which one impurity layer uses the organic material and the other impurity layer uses the inorganic material, and the carrier injection capacity of the metal/metal structure has different characteristics according to the cases.

As shown in Table 2, the p-n junction structure has the best characteristics when using the organic material/organic material.

Therefore, it may be summarized as follows: to obtain good characteristics, an exemplary embodiment involves the organic n doping group being used as the n-type impurity layer and the organic p doping group or the deep LUMO HIL group being used as the p-type impurity layer. However, exemplary embodiments of the present invention are not limited to the combination of the above-described materials.

The emission layers 383, 393 may include red sub-emission layers, blue sub-emission layers, and green sub-emission layers. That is, the emission layers 383, 393 include all of the red sub-emission layers, blue sub-emission layers, and green sub-emission layers, thereby displaying the white, or one of them corresponding to one color. When displaying one color, the upper and lower emission layers 393, 383 may be the same color, and the color filter 230 of the substrate 110 may be omitted. On the other hand, the arrangement of the red sub-emission layers, the blue sub-emission layers, and the green sub-emission layers may be changed according to their characteristics. The layers having the lowest emission efficiency among the sub-emission layers may be in the middle. The layer having excellent hole transport may be at the side of pixel electrode 191. The layer having excellent electron transport may be at the side of the common electrode 270.

In the organic light emitting device in accordance with an exemplary embodiment of the present invention, the pixel electrode 191, the organic light emitting member 370, and the common electrode 270 form the organic light emitting element LD, wherein the pixel electrode 191 is an anode and the common electrode 270 is a cathode. However, alternatively, the pixel electrode 191 may be the cathode and the common electrode 270 may be the anode, and the inner structure of the organic light emitting member 370 would be opposite to the structure described above with reference to FIG. 4.

The emission characteristics of the organic light emitting element LD in FIG. 4 change according to the thickness of the overdoping layers 375-1, 375-2 among the light emitting members 370, and accordingly the thickness of each overdoping layer 375-1, 375-2 is appropriately controlled to drive with the low voltage while having optimized current efficiency.

Now, the current density as a function of voltage in the organic light emitting element without the overdoping layer 375 will be described with reference to FIG. 5. which shows the current density for conventional art A and conventional art B.

The conventional art A is a technique in which one light emitting member is formed in the organic light emitting element, and the conventional art B is a technique in which two light emitting members are overlapped in the organic light emitting element but that does not have the overdoping layer between two light emitting members.

Figure 5:
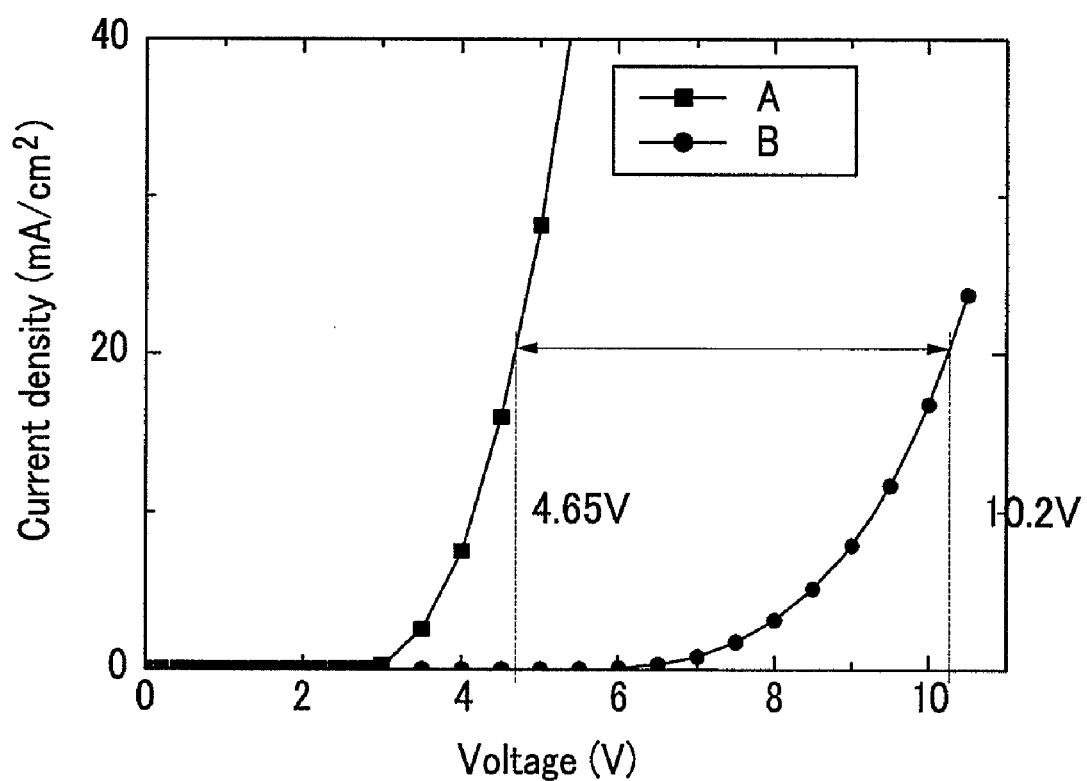
FIG. 5 is a graph showing current density as a function of voltage in the conventional art.

As shown in FIG. 5, the voltage difference between the pixel electrode 191 and the common electrode 270 is 4.65V to have a uniform current density (for example about 20 mA/cm2) in the conventional art A. However, the voltage difference is 10.2V for the same current density in the conventional art B. That is, the conventional art B must apply a voltage of more two times to obtain the uniform current density such that the power efficiency is lower as compared with the conventional art A even though the same current efficiency is obtained. However, the conventional art B has low efficiency, but the lifetime is long due to the double emission layers and is thereby being used.

While the conventional art B is used for its long lifetime, the conventional art B must be additionally applied with a voltage of 0.9V more than two times the voltage as compared with the conventional art A for the current density of about 20 mA/cm2, and this is a voltage that is consumed to generate tunneling in the junction.

The light emitting members are overlapped in the conventional art B such that the interval between the electrodes is long and thereby the voltage of larger than two times is needed as compared with the conventional art A. However, it can be difficult to apply a voltage of more than two times as compared with the conventional art A.

As such, in accordance with an exemplary embodiment of the present invention the overdoping layer 375 is formed between the overlapping light emitting members so to be close to the voltage of two times. The overdoping layer 375 between the light emitting members is used such that equal current density may be obtained through the driving of the low voltage and provide maximum current efficiency.

Figure 6:
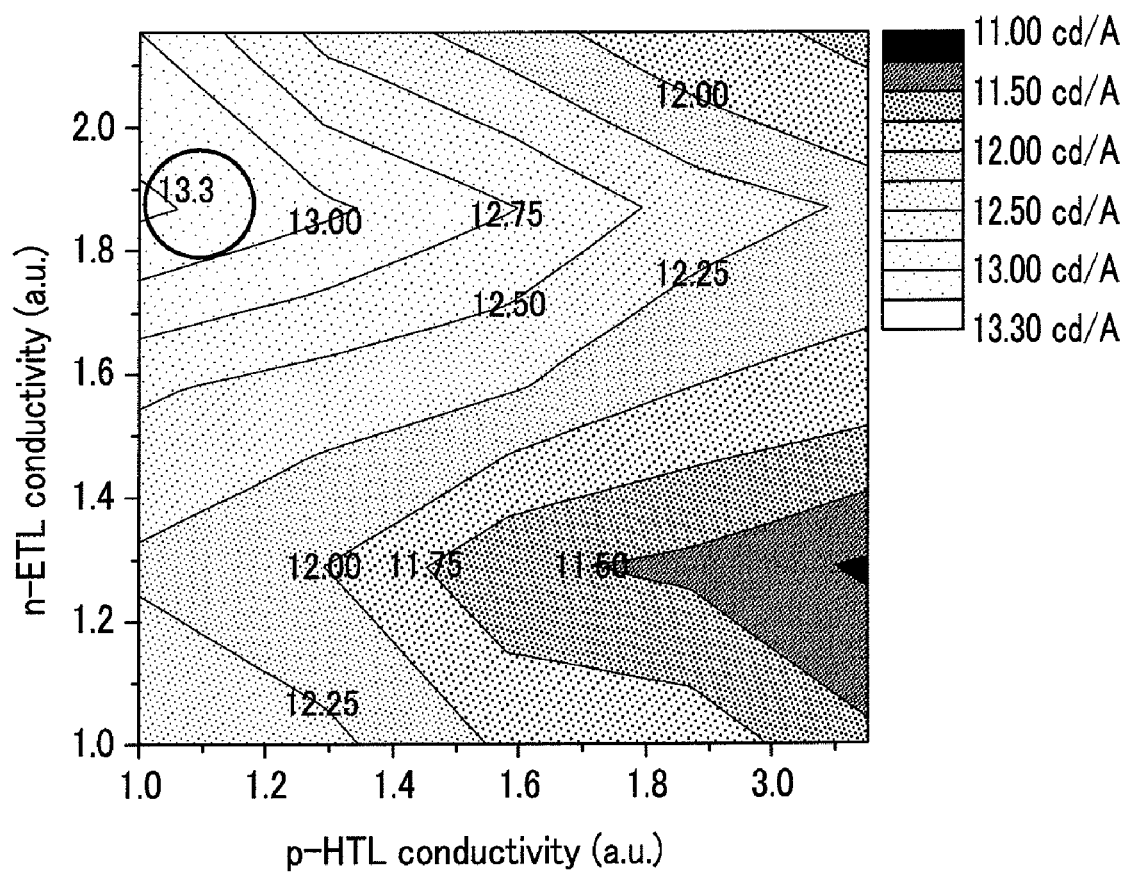
FIG. 6 is a graph showing current efficiency as a function of electrical conductivity of a p-type impurity layer and an n-type impurity layer.

Referring now to FIG. 6 which is a graph showing current efficiency (cd/A) as a function of electrical conductivity of the p-type impurity layer and of the n-type impurity layer, it can be seen that the electrical conductivity of the p-type impurity layer and the n-type impurity layer is controllable to optimize the balance of the electrons and the holes in the emission layer and thereby obtain a maximum current efficiency. In FIG. 6, when the electrical conductivity of the p-type impurity layer is more than 1.0 and less than 1.1 and the electrical conductivity of the n-type impurity layer is more than 1.8 and less than 1.9, and the maximum current efficiency has a value of 13.3 cd/A (as indicated by the circle on the graph).

Therefore, for each exemplary embodiment, the current efficiency as a function of electrical conductivity of the p-type impurity layer and the n-type impurity layer is measured as shown in FIG. 6 to maintain the electrical conductivity of the p-type and n-type impurity layers having the maximum current efficiency, and then the overdoping layer 375 is formed such that that the current efficiency of the organic light emitting element may be controlled to more than the predetermined level. The current density and the luminance as a function of voltage are changed according to the thickness of the overdoping layer 375, and this will be described by using exemplary embodiments as shown in Table 3.

TABLE 3

| Exemplary embodiment | Structure | Thickness (Å) |
|---|---|---|
| Exemplary embodiment A | Single light emitting member structure | 300 |
| Exemplary embodiment B | n-type impurity layer/p-type impurity layer | 300/300 |
| Exemplary embodiment C-1 | n-type impurity layer/n-type overdoping layer/p-type overdoping layer/p-type impurity layer | 280/20/20/280 |
| Exemplary embodiment C-2 | n-type impurity layer/n-type overdoping layer/p-type overdoping layer/p-type impurity layer | 260/40/40/260 |
| Exemplary embodiment C-3 | n-type impurity layer/n-type overdoping layer/p-type overdoping layer/p-type impurity layer | 240/60/60/240 |
| Exemplary embodiment C-4 | n-type impurity layer/n-type overdoping layer/p-type overdoping layer/p-type impurity layer | 220/80/80/220 |
| Exemplary embodiment C-5 | n-type impurity layer/n-type overdoping layer/p-type overdoping layer/p-type impurity layer | 200/100/100/200 |

Here, the sum of the thickness of the p-type or the n-type impurity layer 392, 382 and the p-type or the n-type overdoping layers 375-2, 375-1 forming the p-n junction is uniformly maintained at 300 Å. This is because the thickness having the maximum current efficiency is 300 Å as found through the corresponding exemplary embodiments, and various thicknesses may be applied according to the exemplary embodiments. The p-type impurity layer 392, the n-type impurity layer 382, and the overdoping layer 375-1, 375-2 may have different thicknesses.

Figure 7:
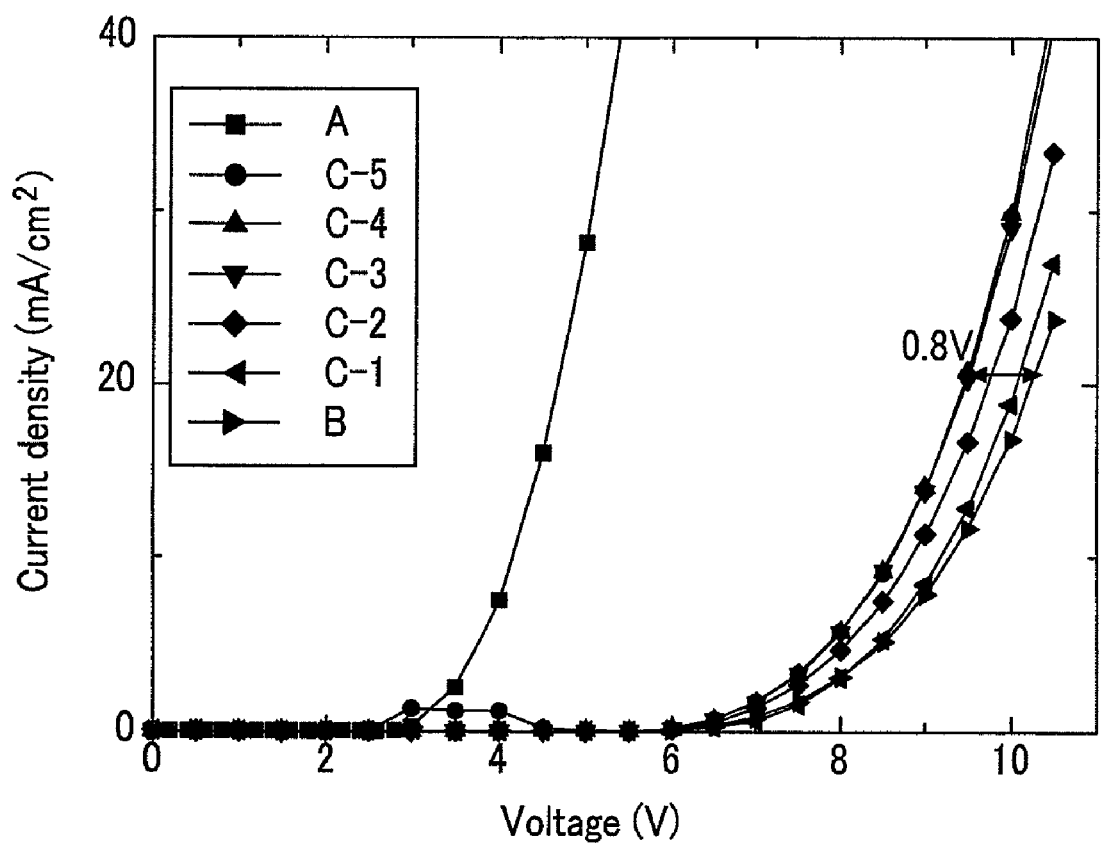
FIG. 7 is a graph showing current density as a function of voltage according to an exemplary embodiment of the present invention.
Figure 8:
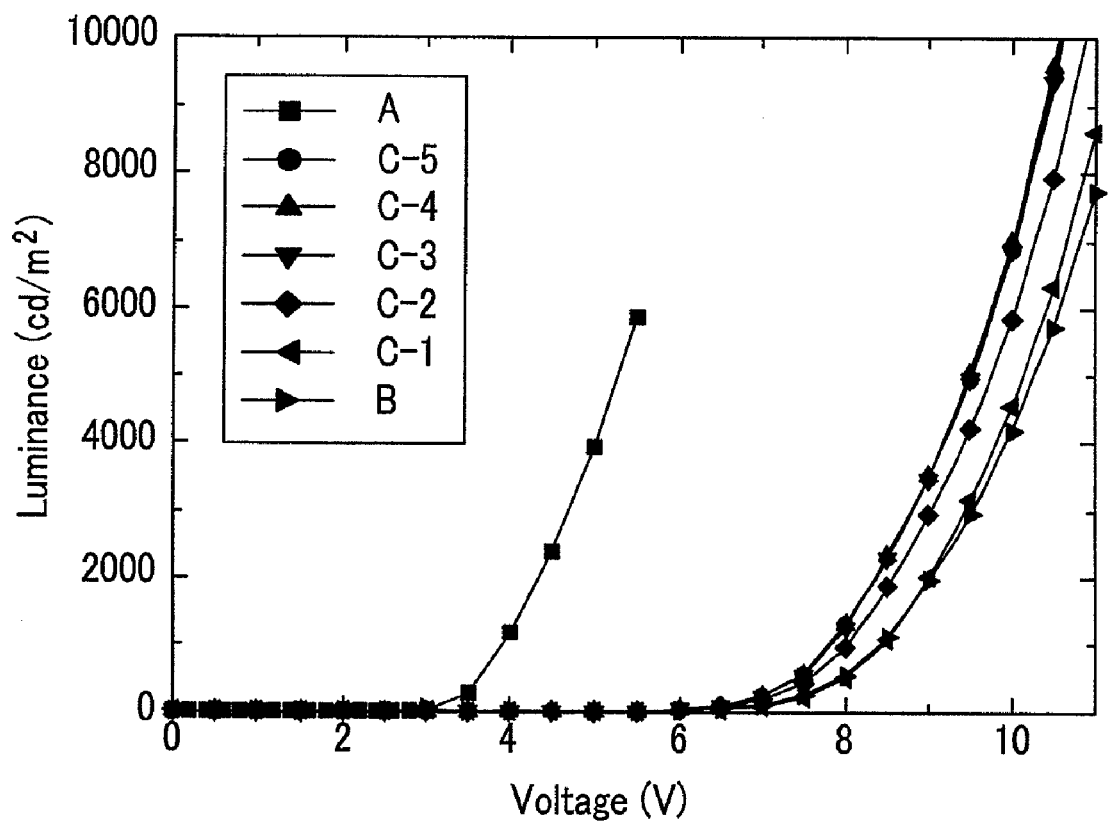
FIG. 8 is a graph showing luminance as a function of voltage according to an exemplary embodiment of the present invention.

The simulated result through the above-described exemplary embodiment will be described with reference to FIGS. 7 and 8, where FIG. 7 is a graph showing current density as a function of voltage and FIG. 8 is a graph showing luminance as a function of voltage.

First, referring to FIG. 7, as compared with the conventional art B, the exemplary embodiments C-1 to C-5 need a lower voltage for the same current density.

Particularly, exemplary embodiment C-2 requires a lower voltage than exemplary embodiment C-1, and exemplary embodiment C-3 requires a lower voltage than exemplary embodiment C-2. Exemplary embodiment C-3, exemplary embodiment C-4, and exemplary embodiment C-5 having the overdoping layer of more than the predetermined thickness have current density curves of similar voltages. That is, a limitation state is represented in which the voltage is not reduced even though the overdoping layer 375 of more than the predetermined thickness is used. This is because the quantities of the sufficient electrons and holes exist in the junction region and thereby the lowest voltage to generate the tunneling is obtained. Also, the portion inside the overdoping layer 375 apart from the junction region by the predetermined distance becomes insignificant for the function of tunneling, and the consumed voltage is small such that the overdoping layer 275 of more than the predetermined thickness has a similar voltage characteristic. As a result, exemplary embodiments C-3 to C-5 have the same current density through the voltage of two times as compared with the conventional art A.

Referring to the graphs of FIGS. 7 and 8, the thickness of one of the overdoping layers 375 may be more than 40 Å to improve the voltage characteristic as compared with exemplary embodiment B without the overdoping layer, and the entire thickness of the overdoping layer 375 may be more than 80 Å. On the other hand, the thickness of one of the overdoping layers 375-1, 375-2 may be more than about 35 Å, and the entire thickness of the overdoping layer 375 may be more than 75 Å.

On the other hand, referring to the thickness of the overdoping layer with reference to the ratio of the thickness of the impurity layer contacting the overdoping layer to the thickness of the overdoping layer, the thickness of the overdoping layer may be determined to have a ratio of thickness of less than 4 to obtain the improved voltage characteristic as compared with exemplary embodiment B. Further, with respect to tolerance, the thickness of the overdoping layer may be determined to have a ratio of thickness of less than 4.5.

Figure 9:
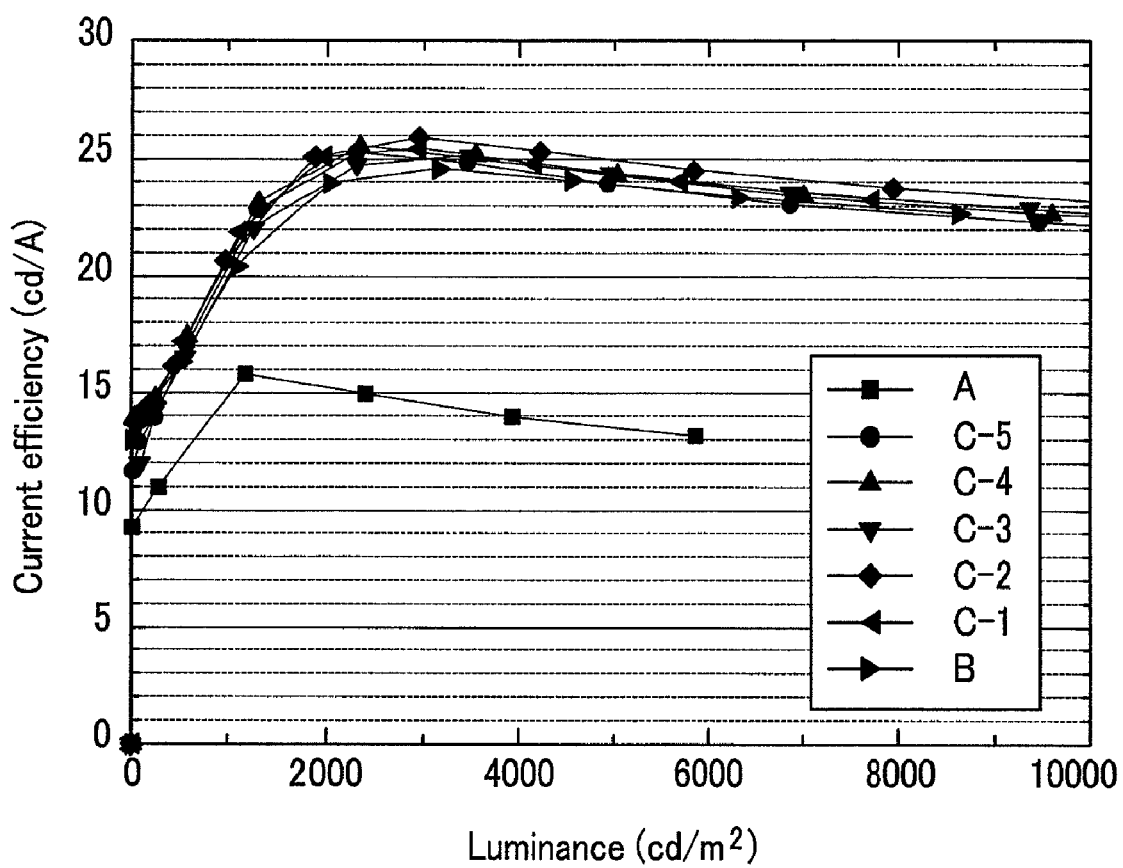
FIG. 9 is a graph showing current efficiency as a function of luminance according to an exemplary embodiment of the present invention.

FIG. 9 is a graph of current efficiency as a function of luminance in accordance with exemplary embodiments of the present invention. The conventional art B and the exemplary embodiments C-1 to C-5 applied to the present experiments represent current efficiency as a function of similar luminance. This shows the benefit of the impurity layer of FIG. 6 being adapted to the condition to maximize the current efficiency of the electrical conductivity and to the uniform thickness condition.

It may be summarized as follows, and as shown in FIGS. 7 to 9, the overdoping layer is formed to flow the same current through the low voltage as compared with the conventional art, and to display the high luminance. Also, if the thickness of the overdoping layer and the thickness of the impurity layer contacting the overdoping layer are optimized, the current efficiency is maximized, and the voltage according thereto is reduced and thereby the improved low voltage is possible.

FIG. 10 is a table showing color coordinates, current efficiency, power efficiency, and external quantum efficiency according to each exemplary embodiment of the present invention. Comparing conventional art B and the exemplary embodiments C-1 to C-5 with regard to color coordinates, the difference is small such that the color coordinate may be used as is.

Also, referring to the current efficiency measured at the luminance of 4000 nit, the difference between the conventional art B and the exemplary embodiments C-2 to C-5 is small. On the other hand, referring to the power efficiency measured at the luminance of 4000 nit, power efficiencies of the exemplary embodiments C-2 to C-5 are improved. That is, in the state in which the current efficiency is similar to the conventional art, the driving voltage is reduced through the overdoping layer 375 such that the power efficiency is increased.

In the case of the exemplary embodiment C-1, the measured value of the current efficiency is lower than in exemplary embodiment B, and the power efficiency is also low such that exemplary embodiment B-1 may be used in place of exemplary embodiment C-1. However, when it is important to reduce the driving voltage, exemplary embodiment C-1 may be used.

Also, referring to external quantum efficiency at the luminance of 4000 nit, all except for exemplary embodiment C-1 have improved efficiency with respect to conventional art B.

For the exemplary embodiment of FIG. 4, the characteristics of the exemplary embodiment in two overdoping layers 375-1, 375-2 were described. Exemplary embodiment C-1 has lower efficiency than the conventional art B in some cases. However, exemplary embodiment C-1 may be replaced with the conventional art B such that the driving voltage may be reduced.

Figure 11:
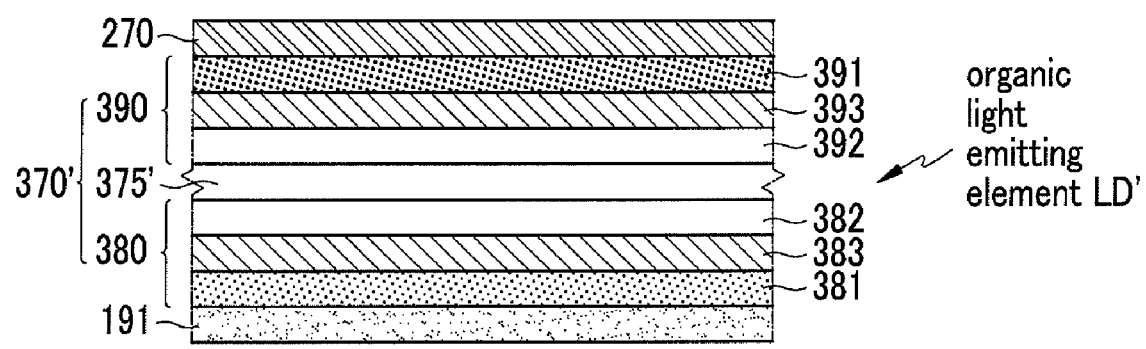
FIG. 11 is a schematic cross-sectional view of an organic light emitting diode according to an exemplary embodiment of the present invention.

Next, an exemplary embodiment different from the exemplary embodiment of FIG. 4 will be described with reference to FIG. 11, which is a schematic cross-sectional view of an OLED. As shown in FIG. 11, an organic light emitting member 370' includes a lower light emitting member 380, an upper light emitting member 390, and an overdoping layer 375' formed therebetween, the overdoping layer 375' being different from the overdoping layer 375 of the exemplary embodiment of FIG. 4.

The lower light emitting member 380 includes emission layer 383 and impurity layers 381, 382. The upper light emitting member 390 includes emission layer 393 and impurity layers 391, 392. The overdoping layer 375' is between lower light emitting member 380 and upper light emitting member 390.

The impurity layers 381, 382 of the lower light emitting member 380 include a p-type impurity layer 381 contacting the pixel electrode 191 and an n-type impurity layer 382 at the opposite side thereof. The impurity layers 391, 392 of the upper light emitting member 390 include an n-type impurity layer 391 contacting the common electrode 270 and a p-type impurity layer 392 at the opposite side thereof. The overdoping layer 375' is formed between the n-type impurity layer 382 of the lower light emitting member 380 and the p-type impurity layer 392 of the upper light emitting member 390 forming the p-n junction along with the overdoping layer 375'. Hereafter, the n-type impurity layer 382 of the lower light emitting member 380 and the p-type impurity layer 392 of the upper light emitting member 390 for the p-n junction are respectively referred to as a p-n junction n-type impurity layer 382 and a p-n junction p-type impurity layer 392.

The overdoping layer 375' may be an n-type overdoping layer, or a p-type overdoping layer. Only one layer of overdoping layer 375' is formed according to the characteristics of the p-n junction n-type impurity layer 382 and the p-n junction p-type impurity layer 392, and improved power efficiency and driving at a low voltage are possible as compared with the structure without the overdoping layer.

The overdoping layer 375' may have a thickness corresponding to the thickness of the exemplary embodiments C-1 to C-5 having two overdoping layers. The overdoping layer 375' may have a thickness of about 35 Å (considering tolerances) or more as the minimum thickness of one of the overdoping layers 375-1, 375-2 included in the exemplary embodiments C-2 to C-5 having the good characteristics. On the other hand, overdoping layer 375' included in the present exemplary embodiment may have a thickness corresponding to the sum of the two overdoping layers 375-1, 375-2 in the exemplary embodiments C-2 to C-5 for good power efficiency and low voltage driving.

As above-described, the structure including one overdoping layer 375' may include the p-n junction n-type impurity layer 382, the p-type overdoping layer 375', and the p-n junction p-type impurity layer 392, or the p-n junction n-type impurity layer 382, the n-type overdoping layer 375', and the p-n junction p-type impurity layer 392. Particularly, the structure using the metal oxide and the deep lumo hole injection layer and representing the good characteristics of Table 1 may be used. That is, the structure of the metal oxide/n-type overdoping layer/n-type impurity layer, or the deep lumo hole injection layer/n-type overdoping layer/n-type impurity layer is possible. Here, the p-type impurity layer 392 and the n-type impurity layer 382 may be formed by selecting the organic p doping group and the organic n doping group of Table 1 to have the good characteristics.

The overdoping layer 375' according to the exemplary embodiment of FIG. 11 may be formed with the same host and the same dopant as the impurity layers 382 and 392 contacting the overdoping layer 375', and has the dopant doping amount of more than about 1.2 times that of the impurity layers 382, 392, and in an exemplary embodiment, more than about 1.5 times. The performance of the p-n junction in the overdoping layer 375' is improved according to the increase of the dopant doping amount (with reference to weight percent). However, the characteristics may be deteriorated when the dopant doping amount is substantially increased such that in an exemplary embodiment to have the dopant doping amount of less than about 20 times (in an exemplary embodiment about 5 times) as compared with the impurity layer 382, 392.

In addition, the emission layer 383, 393 may include a red sub-emission layer, a blue sub-emission layer, and a green sub-emission layer. That is, the emission layer 383, 393 may include all of the red sub-emission layer, the blue sub-emission layer, and the green sub-emission layer thereby displaying the white, or may include one of them to display one color. When displaying one color, in an exemplary embodiment the upper emission layer 393 and the lower emission layer 383 display the same color, and it is not necessary to form the color filter 230 on the substrate 110. On the other hand, the arrangement of the red sub-emission layer, the blue sub-emission layer, and the green sub-emission layer may be changed according to their characteristics. The layer having the lowest emission efficiency among the sub-emission layers may be in the middle, the layer having the excellent hole transport efficiency may be at the side of pixel electrode 191, and the layer having the excellent electron transport efficiency may be at the side of the common electrode 270.

In the organic light emitting device in accordance with the present exemplary embodiment of FIG. 11, the pixel electrode 191, the organic light emitting member 370', and the common electrode 270 form the organic light emitting element LD', and the pixel electrode 191 is an anode and the common electrode 270 is a cathode. However, alternatively, the pixel electrode 191 may be the cathode, the common electrode 270 may be the anode, and the inner structure of the organic light emitting member 370 may therefore be opposite to the structure described above with reference to FIG. 11.

While exemplary embodiments of the present invention have described in the context of a specific organic light emitting panel, however it is to be understood that the invention is not limited to the disclosed embodiments, or to the specific organic light emitting panel, but, on the contrary, is intended to cover various modifications and equivalent arrangements included within the spirit and scope of the appended claims.

What is claimed is:

1. An organic light emitting element including:
   a first electrode;
   a first emission layer emitting light;
   a first impurity layer of a first conductive type that contacts the first emission layer;
   an overdoping layer that contacts the first impurity layer;
   a second impurity layer of a second conductive type that contacts the overdoping layer;
   a second emission layer that contacts the second impurity layer and emits light;
   a second electrode that faces the first electrode, and
   wherein a doping amount by weight of the overdoping layer is more than about 1.2 times and less than about 20 times a doping amount by weight of one of the first impurity layer of the first conductive type or the second impurity layer of the second conductive type, contacting the overdoping layer.

2. The organic light emitting element of claim 1, further comprising:
   a third impurity layer of the second conductive type between the first electrode and the first emission layer; and
   a fourth impurity layer of the first conductive type between the second electrode and the second emission layer.

3. The organic light emitting element of claim 1, wherein:
   the overdoping layer includes an overdoping layer of the first conductive type and an overdoping layer of the second conductive type;
   the overdoping layer of the first conductive type contacts the first impurity layer of the first conductive type; and
   the overdoping layer of the second conductive type contacts the second impurity layer of the second conductive type.

4. The organic light emitting element of claim 3, wherein:
   a host and a dopant of the overdoping layer of the first conductive type are a same host and dopant of the first impurity layer of the first conductive type that contacts the overdoping layer of the first conductive type; and
   a host and a dopant of the overdoping layer of the second conductive type are a same host and dopant of the second impurity layer of the second conductive type that contacts the overdoping layer of the second conductive type.

5. The organic light emitting element of claim 3, wherein:
   the overdoping layer of the first conductive type or the second conductive type has a thickness of about 35 Å or more; and
   the sum of the thickness of the overdoping layer of the first conductivity type and second conductive type is about 70 Å or more.

6. The organic light emitting element of claim 3, wherein a thickness of the overdoping layer and the first impurity layer of the first conductive type is the same as a thickness of the overdoping layer and the second impurity layer of the second conductive type.

7. The organic light emitting element of claim 1, wherein the overdoping layer comprises one of the overdoping layers of the first conductive type or the second conductive type.

8. The organic light emitting element of claim 7, wherein the thickness of the overdoping layer is about 35 Å or more.

9. The organic light emitting element of claim 7,
wherein the second impurity layer of the second conductive type that contacts the overdoping layer is of a material in one of an organic p doping group, a deep lowest unoccupied molecular orbital (LUMO) hole injection layer group or an oxide metal group; and
wherein the first impurity layer of the first conductive type that contacts the overdoping layer is of a material corresponding to an organic n doping group.

10. The organic light emitting element of claim 9, wherein the overdoping layer is the n-type overdoping layer when the second impurity layer of the second conductive type is made of a material in the deep LUMO hole injection layer group or the oxide metal group.

11. The organic light emitting element of claim 1, wherein the doping amount by weight of the overdoping layer and the doping amount by weight of the impurity layer are based upon a weight percent of a host and a dopant.

12. The organic light emitting element of claim 1, wherein a doping amount by weight of the overdoping layer is more than about 1.5 times and less than about 5 times a doping amount by weight of one of the second impurity layer of the second conductive type or the first impurity layer of the first conductive type contacting the overdoping layer.

13. The organic light emitting element of claim 1, wherein:
the first emission layer and the second emission layer comprise two or more sub-emission layers emitting light of different colors; and
a sum of light emitted from the two or more sub-emission layers is a white color.

14. The organic light emitting element of claim 1, wherein the first emission layer and the second emission layer emit a same primary color.

15. The organic light emitting element of claim 1, wherein:
the first electrode is a pixel electrode made of IZO or ITO, and
the second electrode is a common electrode made of a metal.

16. An organic light emitting device comprising:
an organic light emitting element having an anode, a cathode, and an organic light emitting member between the anode and the cathode;
a driving transistor connected to the organic light emitting element;
a switching transistor connected to the driving transistor;
a gate line connected to the switching transistor; and
a data line connected to the switching transistor and insulated from the gate line,
wherein the organic light emitting member comprises:
a first light emitting member having a first emission layer and a first n-type impurity layer,
a second light emitting member having a second emission layer and a second p-type impurity layer, and
an overdoping layer between the first light emitting member and the second light emitting member, and
wherein a doping amount by weight of the overdoping layer is more than about 1.2 times and less than about 20 times a doping amount by weight of one of the first n-type impurity layer or the second p-type impurity layer, contacting the overdoping layer.

17. The organic light emitting device of claim 16, wherein:
the overdoping layer comprises an n-type overdoping layer and a p-type overdoping layer; and
the n-type overdoping layer contacts the first n-type impurity layer of the first light emitting member and the p-type overdoping layer contacts the second p-type impurity layer of the second light emitting member.

18. The organic light emitting device of claim 16, wherein the overdoping layer comprises one of the n-type overdoping layer or the p-type overdoping layer.

19. The organic light emitting device of claim 18, wherein, when the overdoping layer is the n-type overdoping layer:
the second p-type impurity layer is of a material in one of an organic p doping group, a deep lumo hole injection layer group or an oxide metal group, and
the first n-type impurity layer is of a material in the organic n doping group, and
wherein, when the overdoping layer is the p-type overdoping layer:
the second p-type impurity layer is of a material in the organic p doping group, and
the first n-type impurity layer is of a material in the organic n doping group.

* * * * *